United States Patent
Chang et al.

(10) Patent No.: US 11,343,934 B2
(45) Date of Patent: May 24, 2022

(54) MECHANICAL CLIP LOCK FOR AN INFORMATION HANDLING SYSTEM

(71) Applicant: Dell Products L.P., Round Rock, TX (US)

(72) Inventors: Yaotsung Chang, Taipei (TW); Ling Yi Chu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 217 days.

(21) Appl. No.: 16/549,534

(22) Filed: Aug. 23, 2019

(65) Prior Publication Data

US 2021/0059067 A1 Feb. 25, 2021

(51) Int. Cl.
*H05K 7/14* (2006.01)
*H01R 12/70* (2011.01)
*H01R 13/508* (2006.01)
*H01R 13/426* (2006.01)

(52) U.S. Cl.
CPC ....... *H05K 7/1405* (2013.01); *H01R 12/7011* (2013.01); *H01R 13/426* (2013.01); *H01R 13/508* (2013.01); *H05K 2201/10386* (2013.01)

(58) Field of Classification Search
CPC ........ G06F 1/185; G06F 1/186; G06F 13/409; G06F 1/184; G06F 1/187; G06F 1/16; H05K 7/1404; H05K 7/1405; H05K 2201/10386; H01R 12/7011; H01R 13/426; H01R 13/508
See application file for complete search history.

(56) References Cited

U.S. PATENT DOCUMENTS

| | | | | |
|---|---|---|---|---|
| 5,754,412 | A | * | 5/1998 | Clavin ................... H05K 7/142 174/138 D |
| 9,952,634 | B2 | * | 4/2018 | Samper ..................... G06F 1/16 |
| 10,331,181 | B2 | * | 6/2019 | Ng ......................... H05K 7/142 |
| 2015/0313045 | A1 | * | 10/2015 | Jin .......................... G06F 1/182 361/748 |

* cited by examiner

*Primary Examiner* — James Wu
*Assistant Examiner* — Hung Q Dang
(74) *Attorney, Agent, or Firm* — Baker Botts L.L.P.

(57) ABSTRACT

Systems and methods are disclosed for a mechanical clip lock that may include a rigid substrate; a clip lock pin extending vertically from a surface of the rigid substrate; a semi-rigid arm having a first end coupled to the rigid substrate, the semi-rigid arm extending orthogonally from the rigid substrate; a clip lock socket disposed at a second end of the semi-rigid arm opposite the first end, the clip lock socket configured to releasably engage the clip lock pin; and a plurality of clipping pegs extending vertically from the surface of the rigid substrate, each of the plurality of clipping pegs disposed on an exterior portion of the clip lock pin, the plurality of clipping pegs configured to apply a compression force on a device when the clip lock socket and clip lock pin are releasably engaged, the compression force removably coupling the device to a printed circuit board.

18 Claims, 8 Drawing Sheets

MECHANICAL CLIP LOCK FOR AN INFORMATION HANDLING SYSTEM

BACKGROUND

Field of the Disclosure

The disclosure relates generally to information handling systems, and in particular to a mechanical clip lock structure for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed mechanical clip lock for removably coupling a device to a printed circuit board (PCB) may include: a rigid substrate; a clip lock pin extending vertically from a surface of the rigid substrate; a semi-rigid arm having a first end coupled to the rigid substrate, the semi-rigid arm extending orthogonally from the rigid substrate; a clip lock socket disposed at a second end of the semi-rigid arm opposite the first end, the clip lock socket configured to releasably engage the clip lock pin; and a plurality of clipping pegs extending vertically from the surface of the rigid substrate, each of the plurality of clipping pegs disposed on an exterior portion of the clip lock pin, the plurality of clipping pegs configured to apply a compression force on the device when the clip lock socket and clip lock pin are releasably engaged, the compression force removably coupling the device to the PCB.

In one or more of the disclosed embodiments, the mechanical clip lock further includes a plurality of fastening wedges disposed on exterior portions of the clip lock socket, the plurality of fastening wedges configured to removably couple the mechanical clip lock to the PCB.

In one or more of the disclosed embodiments, a width of the rigid substrate is based on a width of the device.

In one or more of the disclosed embodiments, the rigid substrate and semi-rigid arm are coupled in an interlocking manner.

In one or more of the disclosed embodiments, the rigid substrate and semi-rigid arm are coupled using a two-shot molding process.

In one or more of the disclosed embodiments, the rigid substrate is comprised of polycarbonate/acrylonitrile-butadiene-styrene (PC/ABS) material.

In one or more of the disclosed embodiments, the semi-rigid arm is comprised of thermoplastic elastomer (TPE) material.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes a method and a system for removably coupling a device to a printed circuit board using a mechanical clip lock. Specifically, this document describes a mechanical clip lock for an information handling system that may include a rigid substrate; a clip lock pin extending vertically from a surface of the rigid substrate; a semi-rigid arm having a first end coupled to the rigid substrate, the semi-rigid arm extending orthogonally from the rigid substrate; a clip lock socket disposed at a second end of the semi-rigid arm opposite the first end, the clip lock socket configured to releasably engage the clip lock pin; and a plurality of clipping pegs extending vertically from the surface of the rigid substrate, each of the plurality of clipping pegs disposed on an exterior portion of the clip lock pin, the plurality of clipping pegs configured to apply a compression force on the device when the clip lock socket and clip lock pin are releasably engaged, the compression force removably coupling the device to the PCB.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Figure 1:
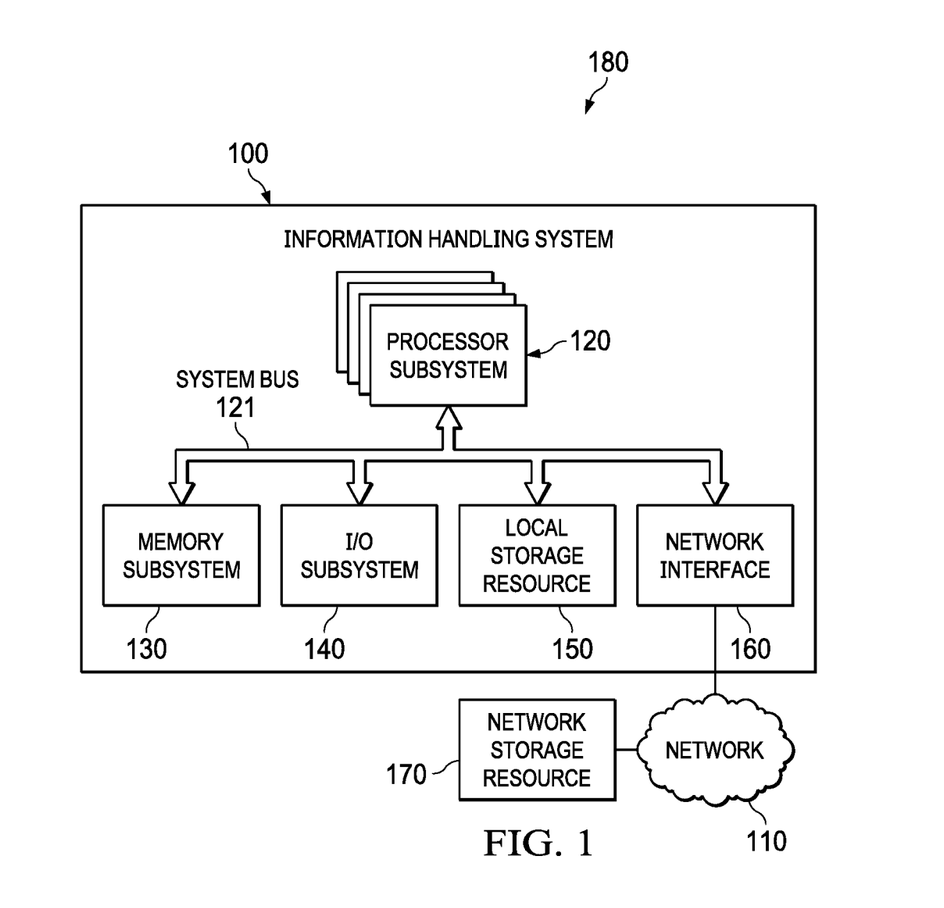
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
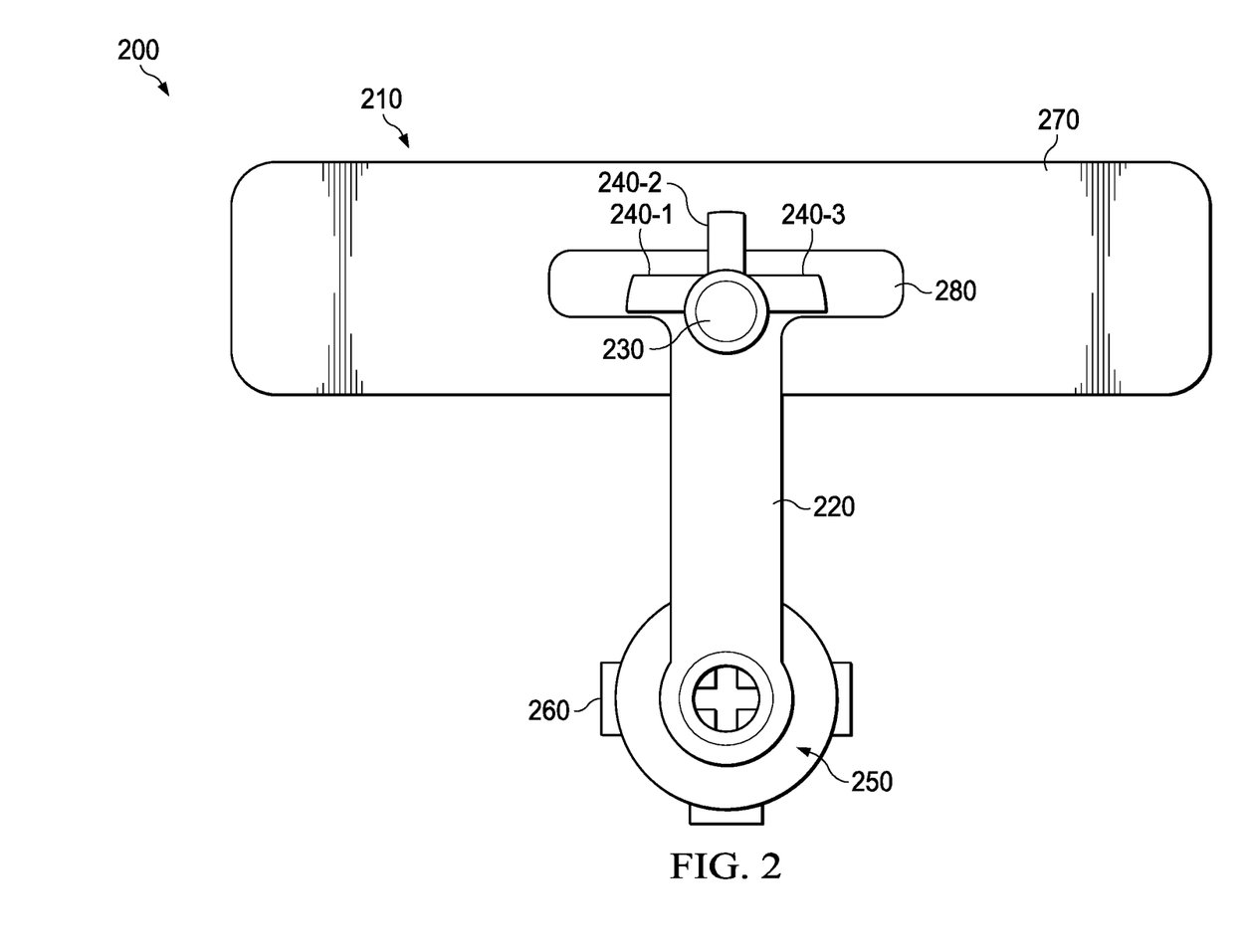
FIG. 2 is a top view of an embodiment of a mechanical clip lock for an information handling system.

FIG. 2 is a top view of an embodiment of a mechanical clip lock for an information handling system. In the embodiment illustrated in FIG. 2, mechanical clip lock 200 includes rigid substrate 210 and semi-rigid arm 220. Rigid substrate 210 includes clip lock pin 230 and clipping pegs 240-1, 240-2, and 240-3 (referred to collectively herein as "clipping pegs 240") on surface 270 of rigid substrate 210. Semi-rigid arm 220 includes clip lock socket 250 and fastening wedges 260. Rigid substrate 210 and semi-rigid arm 220 are coupled together at interlock 280.

In the embodiment illustrated in FIG. 2, mechanical clip lock 200 may be a suitable system, apparatus, or device operable to removably couple a device to IHS 100. In one embodiment, mechanical clip lock 200 may be used to removably couple a device to a chassis, tower, system unit, cabinet, or any other such enclosure used to house devices in IHS 100. In another embodiment, mechanical clip lock 200 may be used to removably couple a device to a printed circuit board (PCB) of IHS 100. For example, mechanical clip lock 200 may be used to removably couple a wireless wide area network (WWAN) card, wireless local area network (WLAN) card, and/or solid state drive (SSD) to a PCB of IHS 100 such that each device, as well as device attachments (e.g., such as antenna cables), may be secured to the PCB without a connection between the device and the PCB becoming loose or otherwise compromised.

In one embodiment, mechanical clip lock 200 may be used for removably coupling devices according to a specification (e.g., M.2, mSATA, and the like) for internally mounting devices and associated connectors (e.g., PCI Express connectors, Serial ATA connectors, and the like). Conventional techniques for removably coupling devices to a chassis or PCB may have utilized a clip bracket system that includes a metal bracket held in position by a screw, washer, and insert nut. Dimensions such as width and length of each metal bracket varied according to the type of device to be removably coupled to a PCB or chassis. For example, a metal bracket manufactured to removably couple an SSD to a PCB may have a specific width that differs from a metal bracket manufactured to removably couple a WWAN card to the PCB. Thus, more time and cost may be spent on manufacturing specific metal brackets for specific devices than utilizing a standardized system across devices. Furthermore, installing each metal bracket using a screw, washer, and insert nut may be labor intensive, particularly for the installation of multiple devices. In contrast, mechanical clip lock 200 includes clipping pegs 240 that may apply a compression force on a device when clip lock pin 230 and clip lock socket 250 are releasably engaged, thereby removably coupling the device to a PCB or chassis. In this way, mechanical clip lock 200 provides a standardized process for installing multiple devices within IHS 100 while additionally providing a reduction in cost and labor as a reduced number of materials may be used to install devices relative to the materials used conventionally (e.g., metal bracket, screw, washer, etc.). In addition, devices may be easily removed from the PCB or chassis by simply disengaging clip lock socket 250 and clip lock pin 230 to return mechanical clip lock 200 to an open position.

In one embodiment, a two-shot molding process may be used to cast mechanical clip lock 200. In particular, a plastic resin such as polycarbonate/acrylonitrile-butadiene-styrene (PC/ABS), for example, may be used to cast rigid substrate 210 in a first shot of the two-shot molding process. In one embodiment, the mold designed to receive the first shot of plastic resin may include molds for rigid substrate 210, clip lock pin 230, and clipping pegs 240 to be molded together as one rigid piece of plastic resin. In another embodiment, rigid substrate 210, clip lock pin 230, and clipping pegs 240 may be molded individually and/or comprised of separate materials. In a second shot of the two-shot molding process, an elastomeric material such as thermoplastic elastomer (TPE), for example, may be used to cast semi-rigid arm 220. In one embodiment, the mold designed to receive the second shot of elastomeric material may include molds for semi-rigid arm 220, clip lock socket 250, and fastening wedges 260 to be molded together as one flexible piece of elastomeric material. In another embodiment, semi-rigid arm 220, clip lock socket 250, and fastening wedges 260 may be molded individually and/or comprised of separate materials. In one embodiment, rigid substrate 210, semi-rigid arm 220, clip lock pin 230, clipping pegs 240, clip lock socket 250, and fastening wedges 260 may each be molded individually and/or comprised of separate materials.

Figure 3A:
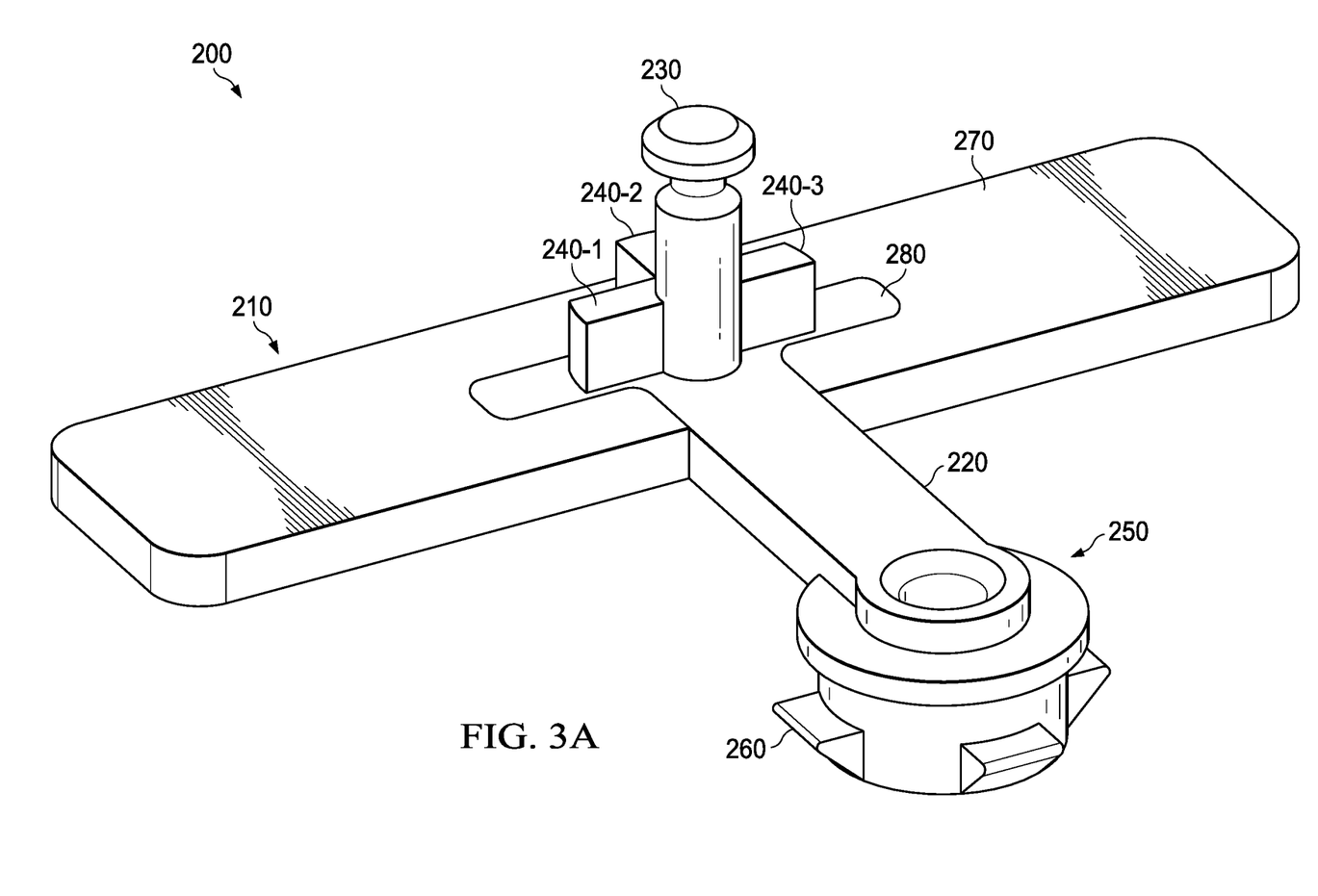
FIG. 3A is a front three quarter view of an embodiment of a mechanical clip lock in an open position.

FIG. 3A is a front three quarter view of an embodiment of a mechanical clip lock in an open position. Mechanical clip lock 200 may be structurally similar to mechanical clip lock 200 of FIG. 2. As shown in FIG. 3A, mechanical clip lock 200 includes rigid substrate 210 and semi-rigid arm 220. Rigid substrate 210 includes clip lock pin 230 and clipping pegs 240 on surface 270 of rigid substrate 210. Semi-rigid arm 220 includes clip lock socket 250 and fastening wedges 260. Rigid substrate 210 and semi-rigid arm 220 are coupled together at interlock 280 as previously described with respect to FIG. 2.

In the embodiment illustrated in FIG. 3A, rigid substrate 210 may be a suitable system, apparatus, or device operable to provide a base for mechanical clip lock 200 components. In particular, rigid substrate 210 may be contoured, or otherwise configured, to provide a base upon which clip lock pin 230 and clipping pegs 240 may be disposed. In one embodiment, rigid substrate 210 may be molded using a plastic resin (e.g., PC/ABS, polyethylene terephthalate, high-density polyethylene, polyvinyl chloride, polypropylene, and the like). In one embodiment, rigid substrate 210 may be molded to include a recessed portion that facilitates coupling with semi-rigid arm 220. In particular, a recessed portion of rigid substrate 210 may saddle semi-rigid arm 220 to form interlock 280. Interlock 280 may be formed during a two-shot molding process to ensure a coupling between the plastic resin material comprising rigid substrate 210 and the elastomeric material comprising semi-rigid arm 220. Specifically, a first shot of plastic resin may form the recessed area within rigid substrate 210 and a second shot of elastomeric material may fill in the recessed area to form interlock 280.

In one embodiment, dimensions (e.g., width, length, height, etc.) of rigid substrate 210 may be based on dimensions associated with devices that are to be removably coupled to a PCB or chassis. In particular, a width and/or length of rigid substrate 210 may be based on an average width and/or length of various devices. In general, dimensions of devices may vary. For example, dimensions of a WWAN card may be different from dimensions of an SSD. Therefore, dimensions of rigid substrate 210 may be standardized such that mechanical clip lock 200 may be used across devices, thereby reducing overall time and cost associated with installing multiple devices. In addition, rigid substrate 210 may have dimensions that accommodate device attachments, if any. For example, a WLAN card may include antenna cables extending from one or more sides. In one embodiment, a width of rigid substrate 210 may be standardized to ensure that such antenna cables are protected from loosening or becoming damaged as the WLAN card is removably coupled to a PCB.

In the embodiment illustrated in FIG. 3A, clip lock pin 230 may be a suitable system, apparatus, or device operable to lock mechanical clip lock 200 in a closed position. In particular, clip lock pin 230 may be contoured, or otherwise configured, to releasably engage clip lock socket 250, thereby locking mechanical clip lock 200 in the closed position shown in FIG. 3B. In one embodiment, clip lock pin 230 may be comprised of a plastic resin that extends vertically from surface 270 of rigid substrate 210. In one embodiment, clip lock pin 230 and rigid substrate 210 may be molded together such that they are comprised of the same plastic resin. In another embodiment, clip lock pin 230 may be comprised of an elastomeric material and coupled to rigid substrate 210 such that clip lock pin 230 extends vertically from surface 270.

In the embodiment illustrated in FIG. 3A, each clipping peg 240-1, 240-2, and 240-3 may be a suitable system, apparatus, or device operable to apply a compression force on a device when mechanical clip lock 200 is locked in a closed position. As shown in FIG. 3A, clipping pegs 240 may be disposed on exterior portions of clip lock pin 230. Clipping pegs 240 may be contoured, or otherwise configured, to apply a compression force on a device when clip lock pin 230 is releasably engaged with clip lock socket 250. In particular, each clipping peg 240-1, 240-2, and 240-3 may make contact with a respective portion of the device when clip lock pin 230 and clip lock socket 250 are releasably engaged, thereby removably coupling the device to a PCB or chassis when mechanical clip lock 200 is locked in the closed position. In one embodiment, each clipping peg 240-1, 240-2, and 240-3 may be comprised of plastic resin that extends vertically from surface 270 of rigid substrate 210. In one embodiment, clipping pegs 240, clip lock pin 230, and rigid substrate 210 may be molded together such that they are comprised of the same plastic resin. In another embodiment, clipping pegs 240 may be comprised of an elastomeric material and coupled to rigid substrate 210 such that clipping pegs 240 extend vertically from surface 270 of rigid substrate 210.

In the embodiment illustrated in FIG. 3A, semi-rigid arm 220 may be a suitable system, apparatus, or device operable to bend to allow an alignment of clip lock pin 230 and clip lock socket 250. As shown in FIG. 3A, semi-rigid arm 220 may include a first end coupled to rigid substrate 210 at interlock 280 and extend orthogonally from rigid substrate 210. Semi-rigid arm 220 may include a clip lock socket 250 disposed at a second end opposite from the first end coupled to the rigid substrate 210. Semi-rigid arm 220 may be contoured, or otherwise configured, to bend to allow clip lock pin 230 and clip lock socket 250 to align such that clip lock socket 250 may releasably engage clip lock pin 230, thereby locking mechanical clip lock 200 in the closed position shown in FIG. 3B. In one embodiment, semi-rigid arm 220 may be molded using an elastomeric material (e.g., TPE, polysulfide rubber, elastolefin, and the like). In other embodiments, semi-rigid arm 220 may be molded using other types of thermoplastics (e.g., polyvinyl chloride, acrylics, fluoropolymers, and the like).

In the embodiment illustrated in FIG. 3A, clip lock socket 250 may be a suitable system, apparatus, or device operable to lock mechanical clip lock 200 in a closed position. In particular, clip lock socket 250 may be contoured, or otherwise configured, to releasably engage with clip lock pin 230, thereby locking mechanical clip lock 200 in the closed position shown in FIG. 3B. As shown in FIG. 3A, clip lock socket 250 may be or include an aperture disposed at the end of semi-rigid arm 220 opposite from the other end of semi-rigid arm 220 coupled to rigid substrate 210 at interlock 280. In one embodiment, clip lock socket 250 may be comprised of elastomeric material. In one embodiment, clip lock socket 250 and semi-rigid arm 220 may be molded together such that they are comprised of the same elastomeric material. In another embodiment, clip lock socket 250 may be comprised of a plastic resin and coupled to semi-rigid arm 220 such that clip lock socket 250 is disposed at the end of semi-rigid arm 220 opposite from the other end of semi-rigid arm 220 coupled to rigid substrate 210 at interlock 280.

In the embodiment illustrated in FIG. 3A, each fastening wedge 260 may be a suitable system, apparatus, or device operable to removably couple mechanical clip lock 200 to a PCB or chassis. As shown in FIG. 3A, fastening wedges 260 may be disposed on exterior portions of clip lock socket 250. Fastening wedges 260 may be contoured, or otherwise configured, to flexibly fit within a mounting hole of a PCB or chassis. In one embodiment, fastening wedges 260 may be comprised of elastomeric material that allows fastening wedges 260 to compress while being inserted through a mounting hole of a PCB or chassis. Once inserted, fastening wedges 260 may regain their wedge shape thereby removably coupling mechanical clip lock 200 to the PCB or chassis. In one embodiment, fastening wedges 260, clip lock socket 250, and semi-rigid arm 220 may be molded together such that they are comprised of the same elastomeric material. In another embodiment, fastening wedges 260 may be comprised of a plastic resin and disposed on exterior portions of clip lock socket 250.

Figure 3B:
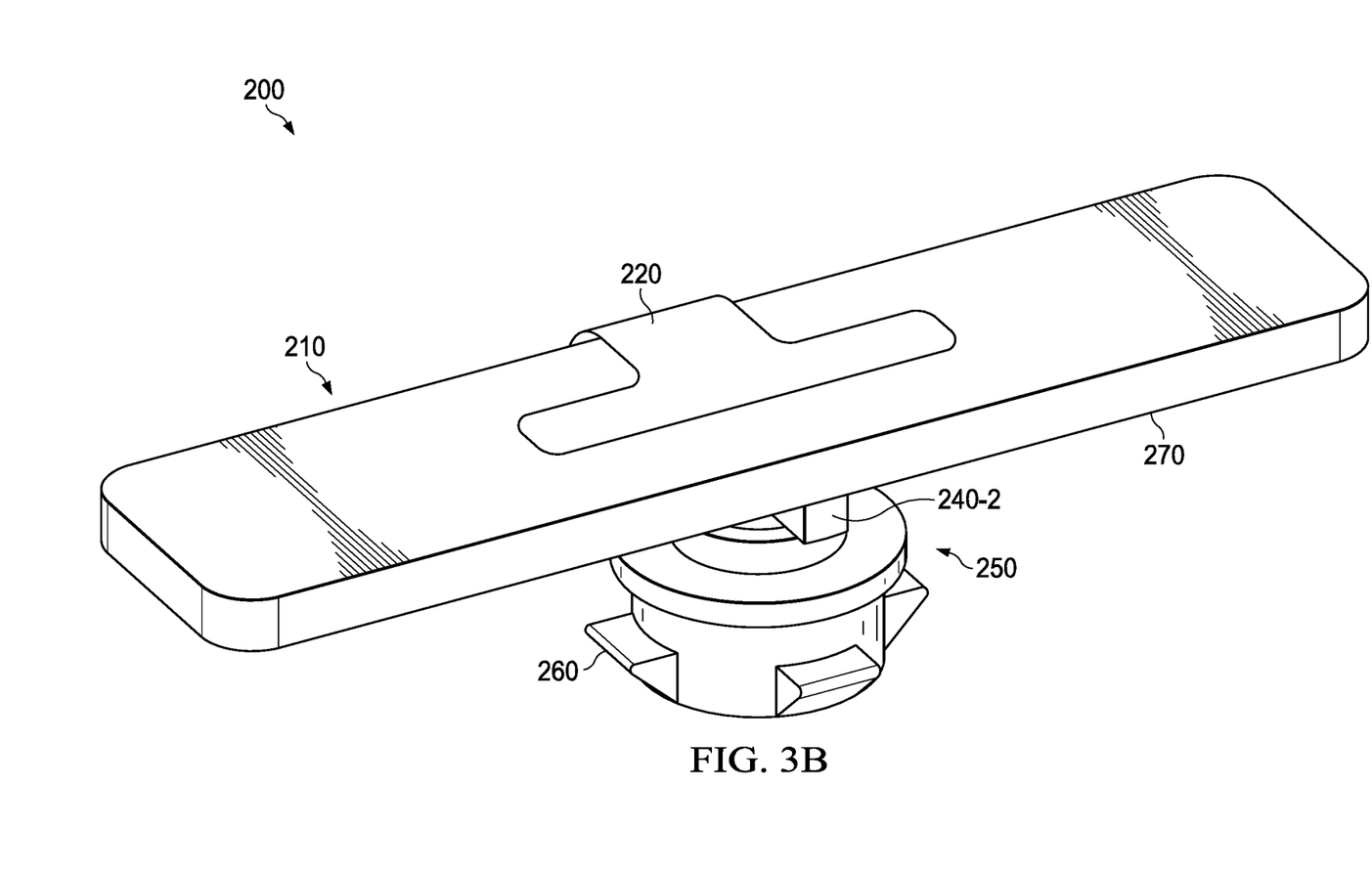
FIG. 3B is a front three quarter view of an embodiment of a mechanical clip lock in a closed position.

FIG. 3B is a front three quarter view of an embodiment of a mechanical clip lock in a closed position. Mechanical clip lock 200 may be structurally similar to mechanical clip lock 200 of FIG. 3A. In the embodiment illustrated in FIG. 3B, mechanical clip lock 200 is in a closed position. In particular, semi-rigid arm 220 has been bent such that clip lock pin 230 and clip lock socket 250 may align. Once aligned, clip lock pin 230 may be inserted into clip lock socket 250 to releasably engage clip lock pin 230 and clip lock socket 250 as described above with respect to FIG. 3A. As shown in FIG. 3B, rigid substrate 210 has been turned over from the orientation shown in FIG. 3A to allow clip lock pin 230 be inserted into clip lock socket 250, causing surface 270 of rigid substrate 210 to face toward clip lock socket 250. In addition. clipping peg 240-2 (as well as clipping pegs 240-1 and 240-3 not expressing shown) has been turned over such that clipping peg 240-2 may establish contact with a device and apply a compression force on the device as clip lock pin 230 is inserted into clip lock socket 250 thereby locking mechanical clip lock 200 in the closed position. Once mechanical clip lock 200 is locked in the closed position, clipping pegs 240 may continue to apply the compression force on the device, thereby removably coupling the device to a PCB or chassis. In order to remove the coupled device from the PCB or chassis, clip lock socket 250 and clip lock pin 230 may simply be disengaged to return mechanical clip lock 200 to the open position shown in FIG. 3A.

Figure 4A:
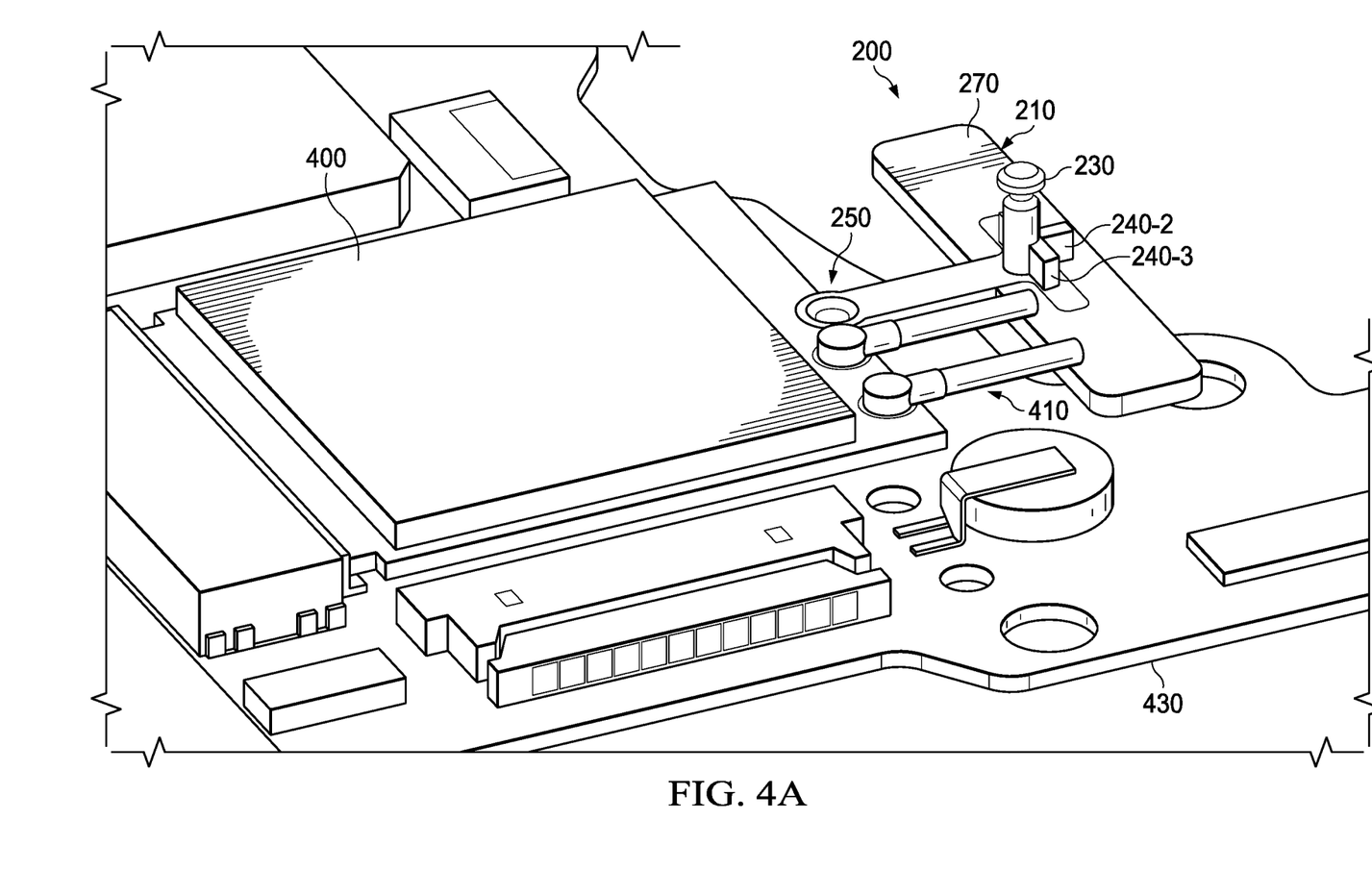
FIG. 4A is a front three quarter view of an embodiment of a mechanical clip lock removably coupled to a printed circuit board in an open position.

FIG. 4A is a front three quarter view of an embodiment of a mechanical clip lock removably coupled to a printed circuit board in an open position. In the embodiment illustrated in FIG. 4A, mechanical clip lock 200 has been removably coupled to printed circuit board (PCB) 430. In particular, fastening wedges 460 of mechanical clip lock 200 have been inserted through a mounting hole (not expressly shown) in PCB 430 such that mechanical clip lock 200 and PCB 430 are removably coupled at the base of device 400. As shown in FIG. 4A, mechanical clip lock 200 is in an open position (i.e., clip lock pin 230 and clip lock socket 250 are not releasably engaged) with antenna cables 410 of device 400 crossing above mechanical clip lock 200. Specifically, antenna cables 410 cross above surface 270 of rigid substrate 210. In addition, clip lock pin 230 and clipping pegs 240 extend vertically from surface 270 of rigid substrate 210.

Figure 4B:
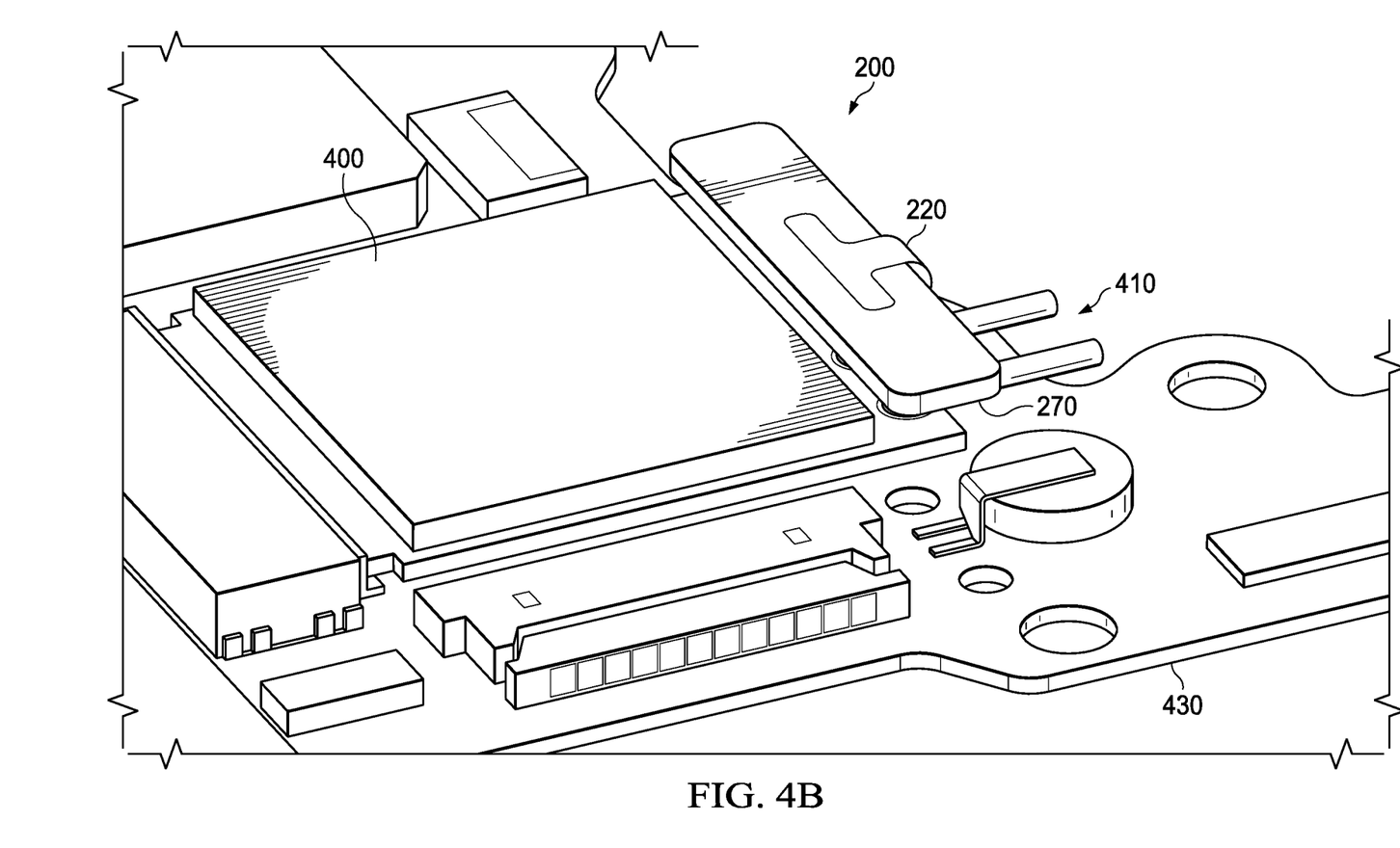
FIG. 4B is a front three quarter view of an embodiment of a mechanical clip lock removably coupled to a printed circuit board in a closed position.

FIG. 4B is a front three quarter view of an embodiment of a mechanical clip lock removably coupled to a printed circuit board in a closed position. In the embodiment illustrated in FIG. 4B, clip lock pin 230 has been inserted into clip lock socket 250 to releasably engage clip lock socket 250 and clip lock pin 230, thereby locking mechanical clip lock 200 in the closed position as previously described with respect to FIG. 3B. In addition, antenna cables 410 have been temporarily moved aside (i.e., away from surface 270) such that rigid substrate 210 may turn over from the orientation shown in FIG. 4A causing surface 270 of rigid substrate 210 to face toward clip lock socket 250. Once mechanical clip lock 200 has been locked in the closed position (i.e., thereby removably coupling device 400 to PCB 430), antenna cables 410 may be placed back into position. As shown in FIG. 4B, antenna cables 410 of device 400 are crossing underneath surface 270 of rigid substrate 210. In this way, rigid substrate 210 may protect device attachments (e.g., antenna cables 410) from becoming loose and/or damaged. Specifically, rigid substrate 210 of mechanical clip lock 200 may cover one or more device attachments underneath rigid substrate 210 while mechanical clip lock 200 is locked in the closed position. By covering the one or more device attachments underneath, rigid substrate 210 may protect the one or more device attachments from becoming loose and/or damaged. In order to remove device 400 from PCB 430, clip lock socket 250 and clip lock pin 230 may simply be disengaged to return mechanical clip lock 200 to the open position shown in FIG. 4A.

Figure 5A:
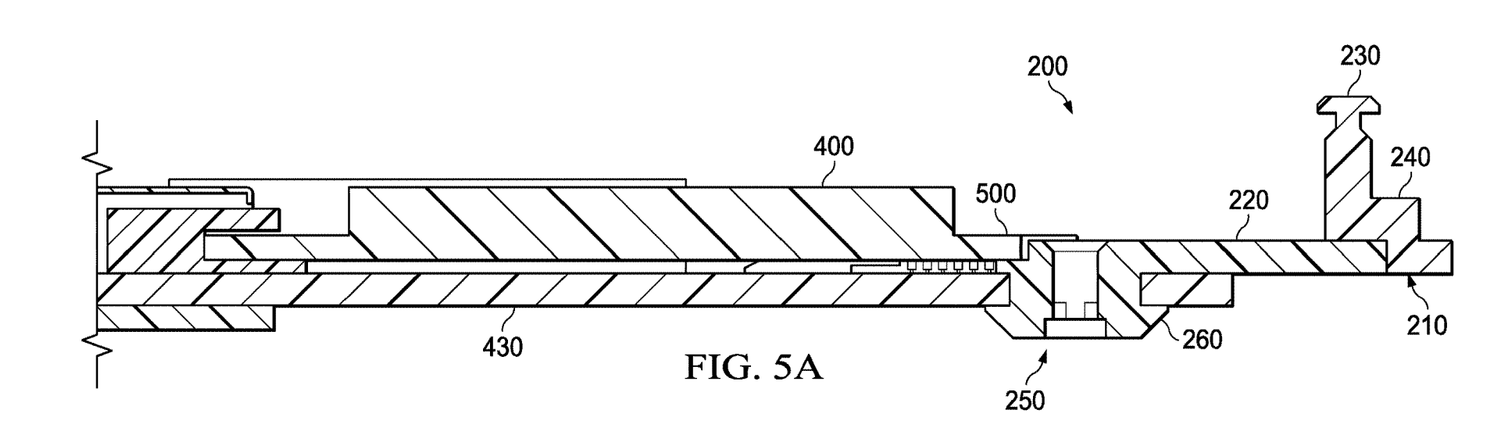
FIG. 5A is a cross-sectional view of an embodiment of a mechanical clip lock removably coupled to a printed circuit board in an open position.

FIG. 5A is a cross-sectional view of an embodiment of a mechanical clip lock removably coupled to a printed circuit board in an open position. In the embodiment illustrated in FIG. 5A, mechanical clip lock 200 is in the open position as described with respect to FIGS. 3A and 4A. Fastening wedges 260 have been inserted through a mounting hole of PCB 430 to removably couple mechanical clip lock 200 to PCB 430 at the base of device 400 as described with respect to FIG. 4A. As shown in FIG. 5A, an edge 500 of device 400 may slightly extend over a portion of clip lock socket 250 once device 400 has been positioned or coupled to connectors of PCB 430.

Figure 5B:
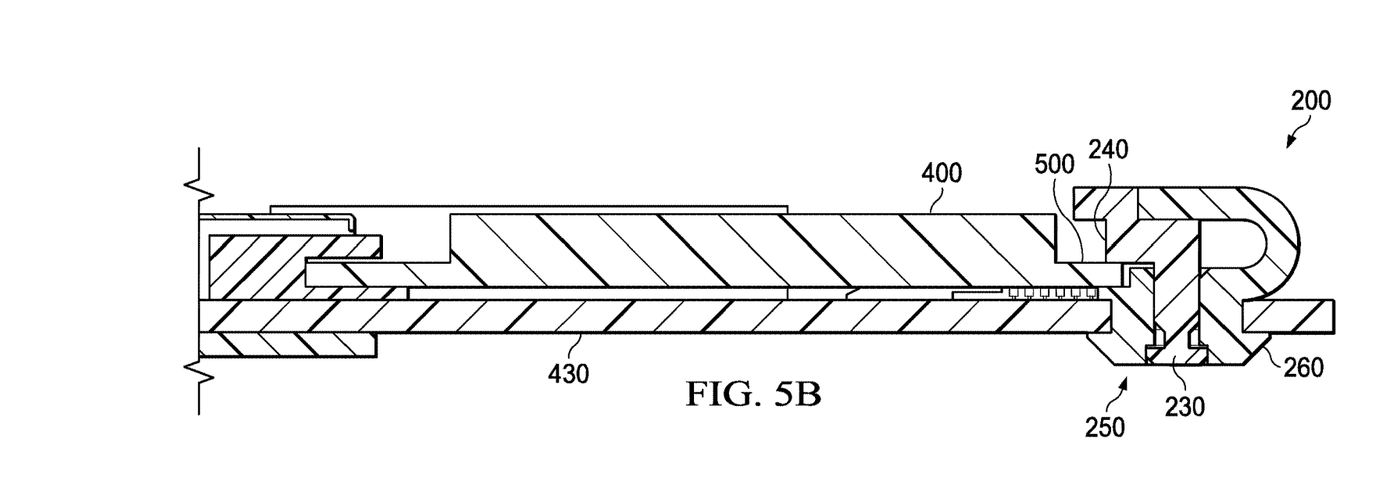
FIG. 5B is a cross-sectional view of an embodiment of a mechanical clip lock removably coupled to a printed circuit board in a closed position.

FIG. 5B is a cross-sectional view of an embodiment of a mechanical clip lock removably coupled to a printed circuit board in a closed position. In the embodiment illustrated in FIG. 5B, mechanical clip lock 200 is in the closed position as described with respect to FIGS. 3B and 4B. As shown in FIG. 5B, clip lock pin 230 has been inserted into clip lock socket 250 to releasably engage clip lock socket 250 and clip lock pin 230. When clip lock socket 250 and clip lock pin 230 are releasably engaged, clipping pegs 240 may make contact with edge 500 of device and apply a compression force on edge of device 400 such that device 400 may be removably coupled to PCB 430. In order to remove device 400 from PCB 430, clip lock pin 230 may simply be removed from clip lock socket 250 to disengaged clip lock socket 250 and clip lock pin 230 thereby returning mechanical clip lock 200 to the open position shown in FIG. 5A.

Figure 6:
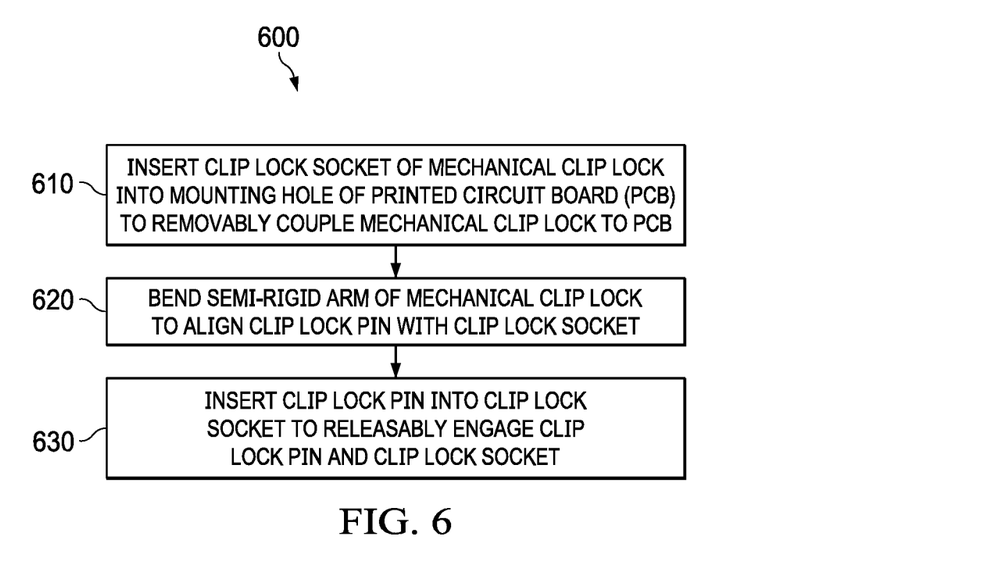
FIG. 6 is a flowchart depicting selected elements of an embodiment of a method for removably coupling a device to a printed circuit board using a mechanical clip lock.

FIG. 6 is a flowchart depicting selected elements of an embodiment of a method for removably coupling a device to a printed circuit board using a mechanical clip lock. It is noted that certain operations described in method 600 may be optional or may be rearranged in different embodiments.

Method 600 may begin at step 610, where clip lock socket 250 of mechanical clip lock 200 can be inserted into a mounting hole of printed circuit board (PCB) 430 to removably couple mechanical clip lock 200 to PCB 430. Turning to the example illustrated in FIG. 2, clip lock socket 250 may be disposed at a first end of semi-rigid arm 220 of mechanical clip lock 200. Semi-rigid arm 220 may have a second end coupled to rigid substrate 210. Rigid substrate 210 may include clip lock pin 230 extending vertically from surface 270 of rigid substrate 210. Rigid substrate 210 may additionally include clipping pegs 240 extending vertically from surface 270, where each clipping peg 240 may be disposed on an exterior portion of clip lock pin 230. Clipping pegs 240 may be configured to apply a compression force on device 400 when clip lock socket 250 and clip lock pin 230 are releasably engaged. The compression force may removably couple device 400 to PCB 430.

In step 620 of method 600 shown in FIG. 6, semi-rigid arm 220 of mechanical clip lock 200 may be bent to align clip lock pin 230 with clip lock socket 250. In step 630, clip lock pin 230 may be inserted into clip lock socket 250 to releasably engage clip lock pin 230 and clip lock socket 250. As shown in the example illustrated in FIG. 5B, when clip lock socket 250 and clip lock pin 230 are releasably engaged, clipping pegs 240 may apply a compression force on device 400 to removably couple device 400 to PCB 430.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A mechanical clip lock for removably coupling a device to a printed circuit board (PCB),
the mechanical clip lock comprising:
a rigid substrate;
a clip lock pin extending vertically from a surface of the rigid substrate;
a semi-rigid arm having a first end coupled to the rigid substrate, the semi-rigid arm extending orthogonally from the rigid substrate;
a clip lock socket disposed at a second end of the semi-rigid arm opposite the first end, the clip lock socket configured to releasably engage the clip lock pin;
a plurality of fastening wedges disposed on exterior portions of the clip lock socket, each of the plurality of fastening wedges comprised of an elastomeric material configured to compress while being inserted through a mounting hole of the PCB, the plurality of fastening wedges configured to removably couple the mechanical clip lock to the PCB; and
a plurality of clipping pegs extending vertically from the surface of the rigid substrate, each of the plurality of clipping pegs disposed on an exterior portion of the clip lock pin, the plurality of clipping pegs configured to apply a compression force on the device when the clip lock socket and clip lock pin are releasably engaged, the compression force removably coupling the device to the PCB.

2. The mechanical clip lock of claim 1, wherein a width of the rigid substrate is based on a width of the device.

3. The mechanical clip lock of claim 1, wherein the rigid substrate and semi-rigid arm are coupled in an interlocking manner.

4. The mechanical clip lock of claim 1, wherein the rigid substrate and semi-rigid arm are coupled using a two-shot molding process.

5. The mechanical clip lock of claim 1, wherein the rigid substrate is comprised of polycarbonate/acrylonitrile-butadiene-styrene (PC/ABS) material.

6. The mechanical clip lock of claim 1, wherein the semi-rigid arm is comprised of thermoplastic elastomer (TPE) material.

7. A method for removably coupling a device to a printed circuit board (PCB) using a mechanical clip lock, the method comprising:
inserting a clip lock socket of the mechanical clip lock into a mounting hole of the PCB to removably couple the mechanical clip lock to the PCB, the clip lock socket disposed at a first end of a semi-rigid arm of the mechanical clip lock, the semi-rigid arm having a second end coupled to a rigid substrate of the mechanical clip lock, the rigid substrate including:
a clip lock pin extending vertically from a surface of the rigid substrate; and
a plurality of clipping pegs extending vertically from the surface of the rigid substrate, each of the plurality of clipping pegs disposed on an exterior portion of the clip lock pin, the plurality of clipping pegs configured to apply a compression force on the device when the clip lock socket and clip lock pin are releasably engaged, the compression force removably coupling the device to the PCB;
bending the semi-rigid arm of the mechanical clip lock to align the clip lock pin with the clip lock socket; and
inserting the clip lock pin into the clip lock socket to releasably engage the clip lock pin and the clip lock socket.

8. The method of claim 7, wherein the mechanical clip lock further comprises:
a plurality of fastening wedges disposed on exterior portions of the clip lock socket, each of the plurality of fastening wedges comprised of an elastomeric material configured to compress while being inserted through the mounting hole of the PCB, the plurality of fastening wedges configured to removably couple the mechanical clip lock to the PCB.

9. The method of claim 7, wherein a width of the rigid substrate is based on a width of the device.

10. The method of claim 7, wherein the rigid substrate and semi-rigid arm are coupled in an interlocking manner.

11. The method of claim 7, wherein the rigid substrate and semi-rigid arm are coupled using a two-shot molding process.

12. The method of claim 7, wherein the rigid substrate is comprised of polycarbonate/acrylonitrile-butadiene-styrene (PC/ABS) material.

13. The method of claim 7, wherein the semi-rigid arm is comprised of thermoplastic elastomer (TPE) material.

14. An information handling system, comprising:
- at least one processor;
- a printed circuit board (PCB);
- a device; and
- a mechanical clip lock for removably coupling the device to the printed circuit board (PCB), the mechanical clip lock comprising:
  - a rigid substrate;
  - a clip lock pin extending vertically from a surface of the rigid substrate;
  - a semi-rigid arm having a first end coupled to the rigid substrate, the semi-rigid arm extending orthogonally from the rigid substrate;
  - a clip lock socket disposed at a second end of the semi-rigid arm opposite the first end, the clip lock socket configured to releasably engage the clip lock pin;
  - a plurality of fastening wedges disposed on exterior portions of the clip lock socket, each of the plurality of fastening wedges comprised of an elastomeric material configured to compress while being inserted through a mounting hole of the PCB, the plurality of fastening wedges configured to removably couple the mechanical clip lock to the PCB; and
  - a plurality of clipping pegs extending vertically from the surface of the rigid substrate, each of the plurality of clipping pegs disposed on an exterior portion of the clip lock pin, the plurality of clipping pegs configured to apply a compression force on the device when the clip lock socket and clip lock pin are releasably engaged, the compression force removably coupling the device to the PCB.

15. The information handling system of claim 14, wherein a width of the rigid substrate is based on a width of the device.

16. The information handling system of claim 14, wherein the rigid substrate and semi-rigid arm are coupled in an interlocking manner.

17. The information handling system of claim 14, wherein the rigid substrate and semi-rigid arm are coupled using a two-shot molding process.

18. The information handling system of claim 14, wherein the rigid substrate is comprised of polycarbonate/acrylonitrile-butadiene-styrene (PC/ABS) material.

* * * * *